United States Patent [19]

Agiman

[11] Patent Number: 5,428,287
[45] Date of Patent: Jun. 27, 1995

| [54] | THERMALLY MATCHED CURRENT LIMIT CIRCUIT |
|---|---|
| [75] | Inventor: Dan Agiman, Mission Viejo, Calif. |
| [73] | Assignee: Cherry Semiconductor Corporation, East Greenwich, R.I. |
| [21] | Appl. No.: 304,425 |
| [22] | Filed: Sep. 12, 1994 |

Related U.S. Application Data

[63] Continuation of Ser. No. 899,503, Jun. 16, 1992, abandoned.

[51] Int. Cl.⁶ ............................ G05F 3/16; H02H 3/00
[52] U.S. Cl. .................................... 323/284; 361/101; 323/907
[58] Field of Search .................. 323/284, 312–316, 323/907, 908; 361/101; 330/297, 298

[56] References Cited

U.S. PATENT DOCUMENTS

| 3,792,316 | 12/1974 | Bondini et al. | 317/31 |
| 3,845,405 | 10/1974 | Leidich | 330/207 |
| 3,924,158 | 12/1975 | Farnsworth | 317/31 |
| 4,021,701 | 5/1977 | Davies | 317/33 |
| 4,287,439 | 9/1981 | Leuschner . | |
| 4,321,648 | 3/1982 | Kaplan | 361/101 |
| 4,330,757 | 5/1982 | Fukaya et al. | 330/298 |
| 4,380,706 | 4/1983 | Wrathall . | |
| 4,703,390 | 10/1987 | Fay et al. | 361/101 |
| 4,750,079 | 6/1988 | Fay et al. | 361/101 |
| 4,779,062 | 10/1988 | Scheraga | 330/298 |
| 4,870,533 | 9/1989 | Bahlmann | 361/101 |
| 5,103,159 | 4/1992 | Breugnot et al. | 323/315 |
| 5,184,061 | 2/1993 | Lee et al. | 323/907 |
| 5,237,481 | 8/1993 | Soo et al. | 323/907 |
| 5,239,256 | 8/1993 | Yoshida | 323/313 |

OTHER PUBLICATIONS

1990 Linear DataBook, *5A and 2.5A High Efficiency Switching Regulators*, pp. 5-36–5-49.

*Primary Examiner*—Steven L. Stephan
*Assistant Examiner*—Matthew V. Nguyen
*Attorney, Agent, or Firm*—Bromberg & Sunstein

[57] ABSTRACT

An overcurrent limit circuit in which the output transistor and current sense transistor share a common collector and common base. A reference voltage is compared with a voltage derived from a current sense resistor. The circuit limits the current to the base of the output transistor in response to the reference voltage threshold being reached at the current sense resistor. A Vbe comparator comprised of two transistors may be used with a first bias current to both transistors and a second bias current to one of the two transistors.

21 Claims, 2 Drawing Sheets

THERMALLY MATCHED CURRENT LIMIT CIRCUIT

This is a continuation of application Ser. No. 07/899,503 filed on Jun. 16, 1992 now abandoned.

BACKGROUND OF THE INVENTION

The present invention is directed to a current limit circuit. In particular, the current limit circuit of the present invention is an integrated circuit that can be used with a metal output resistor.

Current limit circuits are employed to protect devices and loads from excessive damaging currents. They fall into two main classifications—direct current limit schemes and indirect or approximate current limit schemes. The present invention is directed to an approximate current limit circuit. A direct current limit circuit senses the entire available current. An approximate current limit circuit samples only a portion of the total current. The sampling element since it is not ideal, tends to introduce first order errors which in many cases are not compensated for.

FIG. 1 depicts an approximate current limit circuit of the prior art. If the operation of the components of this conventional circuit are considered to be ideal and assuming the Vbe of the output transistor Q0 equals the Vbe of the sense transistor Q1, the current in the output transistor is limited to:

$$I_L = \frac{Vs - Vref}{R_2} \times \frac{Rsns}{R_0}$$

Thus, the current limit amount is sensitive to the reference voltage Vref, the current sense resistor $R_0$, the supply voltage Vs and a resistor ratio $Rsns/R_2$. However, additional thermal errors are introduced into the equation when the base-emitter voltage of power output transistor Q0 is not equal to the base-emitter voltage on the sense transistor Q1. Additional errors may be introduced by mismatching of the sense resistor Rsns and the output resistor R0 due to manufacturing tolerance. Also, where the output resistor R0 is a different type of resistor than the sense resistor, for example, a metal resistor as opposed to a diffusion resistor, the resistor may react differently to temperature changes causing further errors.

Temperature will have no effect if there are ideal emitter areas and current ratio as well as thermal matching. However, since the power output transistor Q0 and the sensing transistor Q1 are physically apart from one another, the instantaneous junction temperature across the power structure is significantly higher than that on the sensing transistor due to the larger total power generated at the output transistor. The higher temperature rise lowers the base-emitter voltage on the output power transistor. This in turn exponentially increases the output current causing further reduction of the base-emitter voltage initiating a positive thermal feedback loop. This in some cases may lead to thermal runaway resulting in "hot spots" and eventual structural failure. In a thermal runaway situation, the current limit circuit loses control of the output current. However, the thermal conductivity of the silicon allows the heat to propagate from the output transistor to the sensing transistor so as to develop a negative thermal feedback by which the current limit circuit can eventually regain control.

In conventional circuits such as that disclosed in FIG. 1, some thermal gradient will always exist and is obviously a function of the lateral distance between the circuit elements and the package type. Interestingly enough, a device utilizing a power package with a heat sink will experience a larger thermal gradient per lateral dimension than without a heat sink. A heat sink introduces a lower vertical thermal resistance causing an increase in the lateral thermal gradient The conventional approximate current control scheme of FIG. 1 controls the emitter currents. Since the output transistor Q0 and the sensing transistor Q1 are subjected to different voltages at their collectors, they have different betas, thus, errors in the collector currents may be generated. This may also be seen in that while the ratio of the base-emitter currents of the output transistor and sensing transistor is fixed, the base-emitter current in the output transistor is supplied from both the collector and the base thereby permitting variations in the collector currents. This variation in the output current is referred to as the early voltage effect. Such an early voltage effect would be found in a conventional current limit circuit such as that disclosed in U.S. Pat. No. 3,845,405 (Leidich).

SUMMARY OF THE INVENTION

The present invention is an overcurrent limit circuit in which the output transistor and current sense transistor both share a common collector and a common base. An output resistor is connected between the emitter of the output transistor and ground. A current sense resistor is connected between the emitter of the current sense transistor and ground. A reference voltage is compared with the voltage derived from the current sense resistor. Current flow through the output transistor is limited in response to the comparison. The invention may be particularly designed with a Vbe comparator and two bias currents to the comparator. The present invention may also advantageously include temperature compensation circuitry for adjusting the reference voltage set by the Vbe comparator in response to changes in temperature.

The circuit according to the present invention advantageously presents constant collector current ratio between the sensing transistor and the output transistor that is free of the early voltage effect. Moreover, since the output transistor and sense transistor share a common base and common collector they are less subject to thermal variations. Other objects and advantages of the present invention will become apparent during the following description of the presently preferred embodiment of the invention taken in conjunction with the drawings.

DETAILED DESCRIPTION OF THE PREFERRED EMBODIMENT

Figure 1:
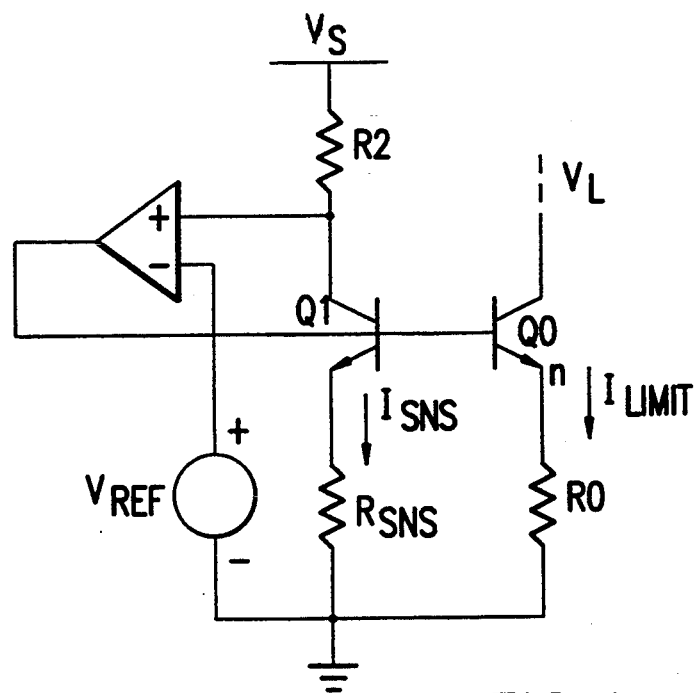
FIG. 1 is a schematic drawing of a current limit circuit of the prior art.
Figure 2:
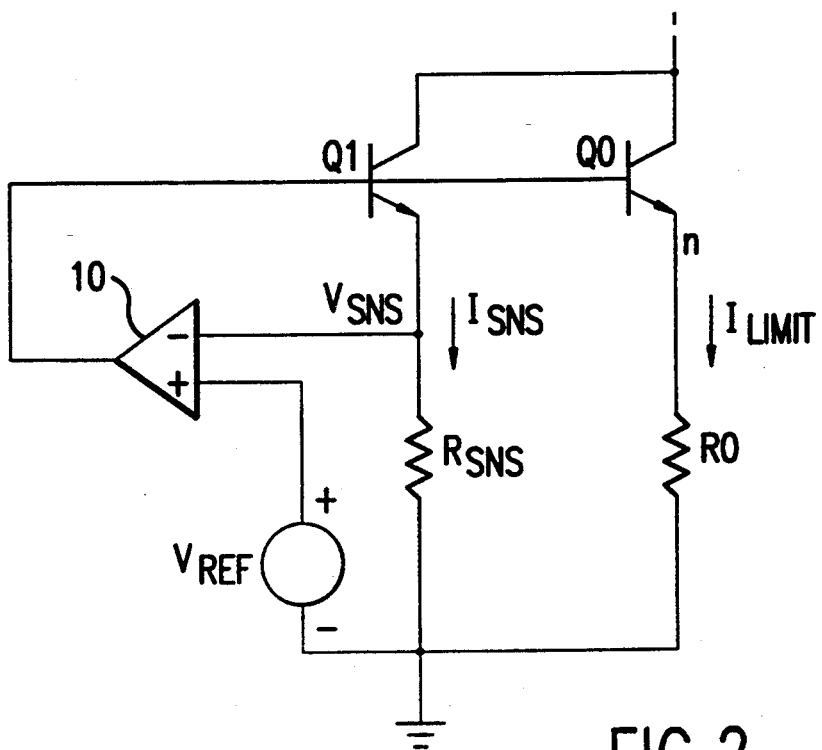
FIG. 2 is a basic schematic diagram of a current limit circuit of the present invention.

Referring now to FIG. 2, the basic circuit of the present invention shall be described. In accordance with the invention, a sensing transistor Q1 forms a part of the output structure. In fact, the output transistor Q0 and the sensing transistor Q1 share a common base and a common collector. In an integrated circuit, the sensing transistor Q1 and the output transistor Q0 may employ the same collector area and base area on a semiconductor chip. Therefore, excellent area and thermal matching is made possible. This arrangement provides a constant collector current ratio between the sensing transistor Q1 and the output transistor Q0 that is free of an early voltage effect.

The emitter of the output transistor Q0 is connected to an output resistor R0. The emitter of the sensing transistor Q1 is connected to a sensing resistor Rsns. The other ends of each of the resistors is connected to ground. The emitter area of the output transistor is N times as large as the emitter area of the sensing transistor Q1. In accordance with the present invention, the output resistor may be much smaller than the sense resistor. The current through the output transistor is made to be over 100 times as large as the sensing current. Thus, the power requirements of the current limit circuit are kept very low. In accordance with a presently preferred embodiment, the emitter area of the output transistor may be a hundred times the size of the emitter area of the sense transistor and the sense resistor may be a thousand times as large as the resistance of the output resistor. The output resister is preferably a metal resistor inside the integrated circuit. To fabricate a small value output diffusion resistor on the integrated circuit is possible but would require a large area on the chip to fit numerous parallel connected diffusion resistors.

An op amp 10 is used to compare a sensing voltage derived from the current sense resistor with a reference voltage and then control the output current. As shown in FIG. 2, the sensing voltage is taken from the emitter of the sense transistor Q1 at one end of the current sense resistor Rsns. The sensing voltage is provided to one input of the op amp 10. The other input of op amp 10 is a reference voltage. As the sensing current increases, the sensing voltage Vsns increases. The reference voltage sets a threshold limit such that when the sensing voltage reaches the reference voltage, the op amp 10 will act to reduce the base current to the output transistor Q0. This will limit the conduction of current through the output transistor to the desired current limit. At the current limit, the voltage across Rsns is Vref, therefore the voltages about the output loop can be added as follows: $V_{ref}+V_{be1}-V_{be0}-I_{LIMIT} \times R_0 = 0$. This equation can be solved for $I_{LIMIT}$ to get $$I_L = \frac{V_{ref}}{R_0} + \frac{V_{be1} - V_{be0}}{R_0}$$

If Vbe1 were equal to Vbe0 and the thermal effects were neglected, then the performance of the circuit of the present invention would be similar to that of a direct current limit scheme. However, as mentioned above, the emitter area of the output transistor is made larger than the emitter area of the sensing transistor in order to increase the output current to sampling current ratio. Therefore, a $\Delta V_{be}$ across the base-emitter of the output transistor will be imposed in any practical design. This introduces a positive thermal coefficient to the current limit due to the positive thermal coefficient of the thermal voltage $V_T$. Additionally, the sensing voltage is practically small, in the presently preferred embodiment a $\Delta V_{be}$ comparator is used. This also introduces thermal coefficient to the current limit. In order to compensate for the thermal coefficient thus generated by the $\Delta V_{bes}$, the preferred embodiment of FIG. 3 has been developed.

Figure 3:
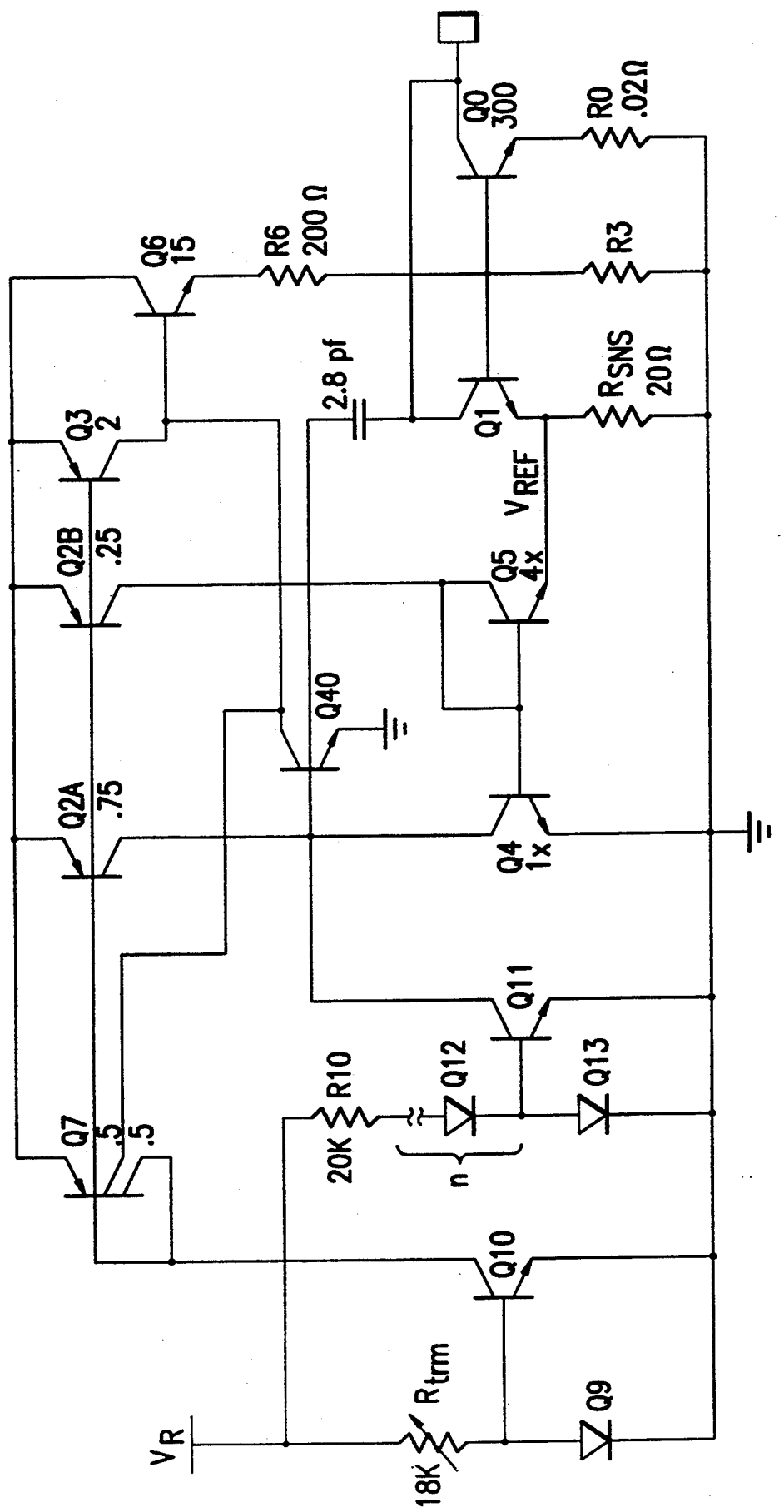
FIG. 3 is a schematic drawing of a current limit circuit of the present invention with temperature compensation.

In FIG. 3, the op amp is formed by transistors Q4, Q5, Q40, Q2A, Q2B, Q3 and Q6. Transistor Q5 and transistor Q4 form a Vbe comparator. With the emitter area of transistor Q5 being four (4) times as large as the emitter area of transistor Q4, the reference voltage set by the Vbe comparator is on the order of 40 mv. The emitter of transistor Q5 is connected to the current sense resistor Rsns and the emitter of the current sense transistor Q1. The base and collector of transistor Q5 are tied together and are connected to the base of transistor Q4. The emitter of transistor Q4 is connected to ground. The collector of transistor Q4 receives the bias currents.

A first bias current for the op amp is developed by diode Q9, transistor Q10 and transistor Q7 as adjusted by trimmable resistor Rtrm. A wide trim range is allowed for with Rtrm so that circuit parameter process variations and B variations can be accommodated. The presently preferred trimmable resistor Rtrm is 18 k ohms. The bias current developed by trimmable resistor Rtrm, diode Q9 and transistor Q10 are provided by the use of current mirrors including transistor Q2A and transistor Q2B to the Vbe comparator. The trimmable resistor Rtrm should be trimmed to provide a reference voltage at the Vbe comparator which provides a desired current limit at a predetermined temperature, such as room temperature.

In accordance with the present invention, a second bias current is generated by a primary reference voltage $V_R$ across a resistor R10 in series with a number of diodes Q12, Q13. The presently preferred primary reference voltage $V_R$ is 2.5 volts. An integral number of diodes Q12 are provided between the resistor R10 and the base of a transistor Q11. A diode Q13 is provided between the base of Q11 and ground. The collector of transistor Q11 provides a bias current to only the transistor Q4 of the Vbe comparator. Diodes Q12 have a negative temperature compensation. By increasing the number of diodes Q12, the voltage across resistor R10 will increase faster in response to temperature rises. This translates to an increased second bias current through the collector of transistor Q11. As the second bias current applied by transistor Q11 to transistor Q4 increases, this will tend to cause the Vbe of transistor Q4 to decrease and the $\Delta V_{be}$ of the Vbe comparator to also decrease. This negative temperature compensation provided by the diodes Q12 acts in opposition to the positive temperature coefficients of the Vbe comparator, the current sensing transistor Q1, the current sense resistor Rsns, the output transistor Q0 and the output resistor R0. Thus, thermal runaway can be avoided by providing a sufficient number of diodes Q12.

A sink transistor Q40 is controlled by the Vbe comparator. When the sensing voltage at sense resistor Rsns reaches the reference voltage Vref set by the Vbe comparator, transistor Q5 starts to turn off and transistor Q4 starts to turn on. This then turns on sink transistor Q40 which diverts and sinks base drive current away from base drive transistor Q6. Base drive transistor Q6 is responsible for providing base current to the output transistor Q0 and the sense transistor Q1. When base drive transistor Q6 loses its base drive current, the output transistor Q0 and sense transistor Q1 are likewise deprived of base drive current. This reduces the output current carried by output transistor Q0 through its collector and emitter.

The embodiment of the present invention is intended to be merely exemplary and those skilled in the art shall be able to make numerous variations and modifications to it without departing from the spirit of the present invention. All such variations and modifications are intended to be within the scope of the present invention as defined in the appended claims.

I claim:

1. An integrated circuit for current limiting comprising:
   an output transistor and a current sense transistor each having an emitter and both sharing a common collector and a common base, the common base receiving an amount of base current;
   a current sense resistor connected between the emitter of said current sense transistor and ground; and
   means for comparing a reference voltage with a voltage derived from said current sense resistor and for controlling the amount of base current to the common base as a function of said comparison so as to hold current flow through said output transistor at a limited level when the voltage derived from said current sense resistor reaches the reference voltage.

2. The integrated circuit for current limiting of claim 1 wherein said means for comparing comprises a Vbe comparator formed by a first transistor and a second transistor.

3. The integrated circuit for current limiting of claim 2 further comprising a first bias means for providing a first bias current to said Vbe comparator and a second bias means for providing a second bias current to said first transistor.

4. The integrated circuit for current limiting of claim 3 wherein said second bias means includes a plurality of diodes for providing said second bias current with a desired variation with respect to temperature.

5. The integrated circuit for current limiting of claim 3 wherein said first bias means includes a trim resistor for setting said first bias current.

6. An overcurrent limit circuit comprising:
   an output transistor and a current sense transistor each having an emitter and both sharing a common collector and a common base;
   a current sense diffusion resistor connected between the emitter of said current sense transistor and ground;
   an output resistor connected between the emitter of said output transistor and ground;
   a Vbe comparator coupled to said current sense resistor said Vbe comparator including a first transistor having a base, an emitter and a collector and a Vbe across the base and the emitter, and said Vbe comparator functioning to compare a voltage derived from said current sense resistor with the Vbe of said first transistor; and
   means, responsive to said Vbe comparator, for limiting current flow through said output transistor.

7. The overcurrent limit circuit of claim 6 wherein said output resistor comprises a metal resistor.

8. The overcurrent limit circuit of claim 6 wherein said Vbe comparator further comprises a second transistor having a base and a collector tied to each other and connected to the base of said first transistor and an emitter larger in size than the emitter of said first transistor and connected to said current sense diffusion resistor.

9. The overcurrent limit circuit of claim 8 further comprising first bias means for providing a first bias current to said Vbe comparator and second bias means for providing a second bias current to said first transistor.

10. The overcurrent limit circuit of claim 9 wherein said second bias means comprises a fixed reference voltage connected across a resistor and a plurality of diodes for providing said second bias current with a desired variation with respect to temperature.

11. The overcurrent limit circuit of claim 10 wherein said first bias means includes a trim resistor connected to said fixed reference voltage for setting said first bias current.

12. The overcurrent limit circuit of claim 6 further comprising a base drive transistor connected to provide drive current to the base of said output transistor and wherein said means for limiting current flow comprises a transistor connected to said Vbe comparator for sinking base current away from the base of said base drive transistor.

13. The integrated circuit of claim 1 wherein the reference voltage varies with temperature.

14. The integrated circuit of claim 13 further comprising bias means for providing a bias current to said means for comparing, said bias means including a plurality of diodes for providing a bias current that varies with respect to temperature in such a way as to compensate for the temperature variation of a ΔVbe across the common base and the emitter of said output transistor.

15. The integrated circuit of claim 1 further comprising an output resistor connected between the emitter of said output transistor and ground.

16. The integrated circuit of claim 1 wherein said means for controlling the amount of said current comprises a base drive transistor having an emitter for providing the amount of base current to the common base and a sink transistor having a base connected to said means for comparing and an emitter connected to a base of said base drive transistor so that the amount of base current to the common base can be reduced by diverting current from the base of said base drive transistor through said sink transistor.

17. An integrated circuit comprising:
   an output transistor and a current sense transistor each having an emitter and both sharing a common collector and a common base;
   a current sense resistor connected between the emitter of said current sense transistor and ground;
   an output resistor connected between the emitter of said output transistor and ground;
   a comparator including at least a first transistor and a second transistor, said second transistor being coupled to said current sense resistor, said comparator comparing a voltage derived from said current sense resistor with a temperature sensitive reference voltage at said first transistor; and
   means, coupled to said comparator, for diverting base current away from the common base whenever the voltage derived from said current sense resistor reaches the temperature sensitive reference voltage.

18. The integrated circuit of claim 17 wherein the temperature sensitive reference voltage comprises a Vbe of said first transistor.

19. The integrated circuit of claim 17 further comprising bias means for providing a bias current to said first transistor, said bias current varying with respect to temperature so as to compensate for variation with temperature of a $\Delta$Vbe across the common base and the emitter of said output transistor.

20. The integrated circuit of claim 19 wherein said bias means comprises a plurality of diodes.

21. The integrated circuit of claim 17 wherein said means for diverting base current comprises a base drive transistor connected to provide drive current to the common base and a sink transistor connected to said comparator for sinking base current away from the base of said base drive transistor.

* * * * *